(12) United States Patent
Shimada et al.

(10) Patent No.: US 6,294,860 B1
(45) Date of Patent: *Sep. 25, 2001

(54) THIN PIEZOELECTRIC FILM ELEMENT, PROCESS FOR THE PREPARATION THEREOF AND INK JET RECORDING HEAD USING THIN PIEZOELECTRIC FILM ELEMENT

(75) Inventors: Masato Shimada; Tetsushi Takahashi; Hiroyuki Kamei; Hong Qiu, all of Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/431,088

(22) Filed: Nov. 1, 1999

Related U.S. Application Data

(63) Continuation of application No. 08/716,610, filed on Sep. 19, 1996.

(30)     Foreign Application Priority Data

Sep. 19, 1995 (JP) .................................................. 7-240372
Dec. 12, 1995 (JP) .................................................. 7-322670
Jul. 19, 1996 (JP) .................................................. 8-190848
Sep. 17, 1996 (JP) .................................................. 8-245353

(51) Int. Cl.⁷ .................................................. H01L 41/08
(52) U.S. Cl. .............................................................. 310/328
(58) Field of Search ........................... 310/311, 363, 310/364, 358, 359, 324, 330

(56)     References Cited

U.S. PATENT DOCUMENTS

| | | | |
|---|---|---|---|
| 5,198,269 | 3/1993 | Swartz et al. | 310/328 X |
| 5,504,388 | 4/1996 | Kimura et al. | 310/328 X |
| 5,594,292 | 1/1997 | Takeuchi | 310/324 |
| 5,600,197 | 2/1997 | Takeuchi | 310/328 |
| 5,691,593 | 11/1997 | Takeuchi | 310/328 |
| 5,774,961 | 7/1998 | Takeuchi | 310/328 X |

FOREIGN PATENT DOCUMENTS

JP 57 087188
  A    5/1982  (EP) .
JP 04 149078
  A    5/1992  (EP) .
0656665    6/1995  (EP) .

*Primary Examiner*—Mark O. Budd
(74) *Attorney, Agent, or Firm*—Sughrue, Mion, Zinn, Macpeak & Seas, PLLC

(57)     ABSTRACT

The present invention provides a thin piezoelectric film having a high piezoelectric strain constant and a good adhesion with a lower electrode which can be produced without being cracked. The present invention also provides an ink jet recording head comprising this thin piezoelectric film as a vibrator. The thin piezoelectric film element of the present invention comprises a PZT film 14 made of a polycrystalline substance, and an upper electrode 16 and a lower electrode 12 arranged with the PZT film interposed therebetween. The grain boundary of the crystalline constituting the PZT film is present almost perpendicular to the surface of the electrode. Further, the orientation of the crystalline constituting the PZT film is controlled to a desired range.

19 Claims, 10 Drawing Sheets

THIN PIEZOELECTRIC FILM ELEMENT, PROCESS FOR THE PREPARATION THEREOF AND INK JET RECORDING HEAD USING THIN PIEZOELECTRIC FILM ELEMENT

This is a continuation of application Ser. No. 08/716,610 filed Sep. 19, 1996, the disclosure of which is incorporated herein by reference.

FIELD OF THE INVENTION

The present invention relates to a thin film type piezoelectric element which transduces electric energy to mechanical energy and vice versa. The piezoelectric element is used as a pressure sensor, temperature sensor, actuator for ink jet recording head or the like. The present invention also relates to such an ink jet recording head. More particularly, the present invention relates to a process for the preparation of the thin piezoelectric film element.

BACKGROUND OF THE INVENTION

In conventional ink jet recording heads, the vibrator which acts as a driving source for injecting an ink is composed of a thin piezoelectric film element. This thin piezoelectric film element normally comprises a thin piezoelectric film made of a polycrystalline substance and an upper electrode and a lower electrode arranged with the thin piezoelectric film interposed therebetween.

This thin piezoelectric film is normally made of a binary system having lead zircotitanate (hereinafter abbreviated as "PZT") as a main component or a tertiary system comprising the binary system having a third component incorporated therein. The thin piezoelectric film having such a composition may be formed, e.g., by sputtering method, sol-gel method, laser abrasion method, CVD method or the like.

A ferroelectric material comprising a binary PZT is disclosed in "Allied Physics Letters", 1991, Vol. 58, No. 11, pages 1161–1163.

Further, JP-A-6-40035 (The term "JP-A" as used herein means an "unexamined published Japanese patent application") and "Journal of The American Ceramic Society", 1973, Vol. 56, No. 2, pages 91–96 disclose a piezoelectric material comprising a binary PZT.

In the case where a thin piezoelectric film element is applied to an ink jet recording head, it is preferred that a thin piezoelectric film (PZT film) having a thickness of from about 0.5 $\mu$m to 25 $\mu$m be used. This thin piezoelectric film must have a high piezoelectric strain constant.

In general, it is reportedly necessary that the PZT film be subjected to heat treatment at a temperature of 700° C. or higher to allow the crystal grains in the thin piezoelectric film to grow in order to obtain a thin piezoelectric film having a high piezoelectric strain constant. As the material constituting the lower electrode in the thin piezoelectric film element there may be used an electrically-conductive material such as platinum, titanium, gold and nickel.

JP-A-6-116095 describes crystal grains constituting a piezoelectric material. This patent discloses a process for the formation of a thin ferroelectric film which comprises applying a precursor solution of lead zircotitanate or lanthanum-containing lead zircotitanate to a platinum substrate which is oriented in (111) plane, characterized in that the application of the precursor solution is followed by heat treatment at a temperature of from 150° C. to 550° C., where a desired crystalline orientation is attained, further followed by calcining at a temperature of from 550° C. to 800° C. for crystallization, whereby a specific crystal plane of the thin film is preferentially oriented along the surface of the substrate according to the heat treatment temperature.

As a prior art technique concerning the present invention there is proposed a process for the preparation of a bulk piezoelectric ceramic as disclosed in JP-A-3-232755. As disclosed in this reference, it is said that a piezoelectric ceramic having a higher density exhibits better piezoelectric characteristics.

Further, JP-A-50-145899 discloses an example of the application of a bulk piezoelectric ceramic in the generation of a high voltage as in gas apparatus. This patent describes that a piezoelectric ceramic having pores having a diameter of from 4 to 10 $\mu$m uniformly dispersed therein and having a specific gravity of from 90% to 93% based on the true specific gravity exhibits a percent discharge rate of 100%.

A conventional ink jet recording head comprising a thin piezoelectric film element is proposed in, e.g., U.S. Pat. No. 5,265,315.

In the case where a thin piezoelectric film (PZT film) having a thickness of not less than 1 $\mu$m is formed, a problem arises that when the foregoing heat treatment is effected to obtain the foregoing high piezoelectric strain constant, cracking can occur in the film. As described in JP-A-3-232755, it is considered that a bulk ceramic having a higher density exhibits better piezoelectric characteristics. However, in order to make a good application of a film having a very high density to an actuator for ink jet recording head, etc., the optimum thickness of the piezoelectric film is from about 0.5 to 25 $\mu$m. When a piezoelectric film having this thickness is produced at a single step, it is normally liable to cracking. If thin films are laminated to avoid cracking, it requires a prolonged production process which is industrially unsuitable.

Further, an approach for raising the thickness of the piezoelectric film by repeating a process which comprises applying a sol or gel composition to a substrate, and then calcining the material at a high temperature is disclosed in "Philips J. Res.", 47 (1993'), pages 263–285. However, this approach is disadvantageous in that the resulting thin piezoelectric film not only has a laminated interface that makes it impossible to provide good piezoelectric characteristics but also exhibits a deteriorated workability.

In general, a thin piezoelectric film is formed on a metal film which has been formed as a lower electrode on a substrate. However, a problem arises that the heat treatment effected during the formation of this thin piezoelectric film causes the substrate to be warped or distorted. Further, it is necessary that a good adhesion be established between the lower electrode and the thin piezoelectric film.

JP-A-50-145899 discloses a piezoelectric element comprising a bulk ceramic suitable for the generation of a high voltage. However, this differs in purpose from the present invention, which concerns a thin piezoelectric film element which can be applied to an ink jet recording head.

U.S. Pat. No. 5,265,315 discloses an ink jet recording head similarly to the present invention. However, this patent has no reference to the pores in PZT as piezoelectric film or the density thereof. Further, the proposed process for the preparation of the piezoelectric film comprises the use of sol-gel method and thus requires the lamination of a plurality of layers and a heat treatment process. Therefore, this proposal is industrially unsuitable.

In the above cited JP-A-6-116095, the orientation by X-ray diffraction wide angle method, i.e., orientation in the plane along the surface of the substrate is discussed. However, X-ray diffractometry of thin film is not discussed.

Further, if a piezoelectric element is used as an actuator for ink jet recording apparatus, etc., good piezoelectric characteristics are required. However, the relationship between crystal orientation and piezoelectric characteristics is not disclosed in JP-A-6-116095

SUMMARY OF THE INVENTION

It is therefore an object of the present invention to provide a thin piezoelectric film element having improved piezoelectric characteristics and a process for the preparation thereof.

It is another object of the present invention to provide a thin piezoelectric film element having a high piezoelectric strain constant.

It is other object of the present invention to provide a thin piezoelectric film element which can be prepared to have a necessary thickness without being cracked.

It is still other object of the present invention to provide a process for the preparation of a thin piezoelectric film element which can provide a thin piezoelectric film element comprising a thin piezoelectric film having a necessary thickness at a single process without causing cracking.

It is further object of the present invention to provide a piezoelectric element comprising a thin piezoelectric film having a good adhesion with a lower electrode.

It is further object of the present invention to provide an ink jet recording head comprising such a thin piezoelectric film element which can provide high precision printing.

These and other objects of the present invention will become more apparent from the following detailed description and examples.

The present invention can accomplish the foregoing objects and concerns a novel improved thin piezoelectric film element. The present invention provides a thin piezoelectric film element comprising a metal film formed on a substrate and a thin PZT film comprising lead zircotitanate having a third component incorporated therein formed on said metal film, wherein said thin PZT film has a rhombohedral crystalline structure which has (100) orientation of not less than 30% as determined by X-ray diffractometry of thin film, thereby enhancing the piezoelectric characteristics of said thin piezoelectric film element.

The foregoing orientation can be accomplished with an arrangement such that the annealing temperature of thin PZT film is from higher than 750° C. to lower than 1,000° C., preferably from not lower than 800° C. to not higher than 1,000° C., and the molar ratio of Zr/Ti is preferably from not less than 35/45 to not more than 45/35.

More preferably, the crystalline structure of the thin piezoelectric film element is further improved. The present invention further provides a thin piezoelectric film element comprising a piezoelectric film made of a polycrystalline substance and an upper electrode and a lower electrode arranged with the piezoelectric film interposed therebetween, wherein the crystalline constituting the piezoelectric film, i.e., the crystal grain boundary, is formed almost perpendicular to the surface of the electrodes.

BRIEF DESCRIPTION OF THE DRAWINGS

By way of example and to make the description more clear, reference is made to the accompanying drawings in which.

DETAILED DESCRIPTION OF THE INVENTION

Figure 1:
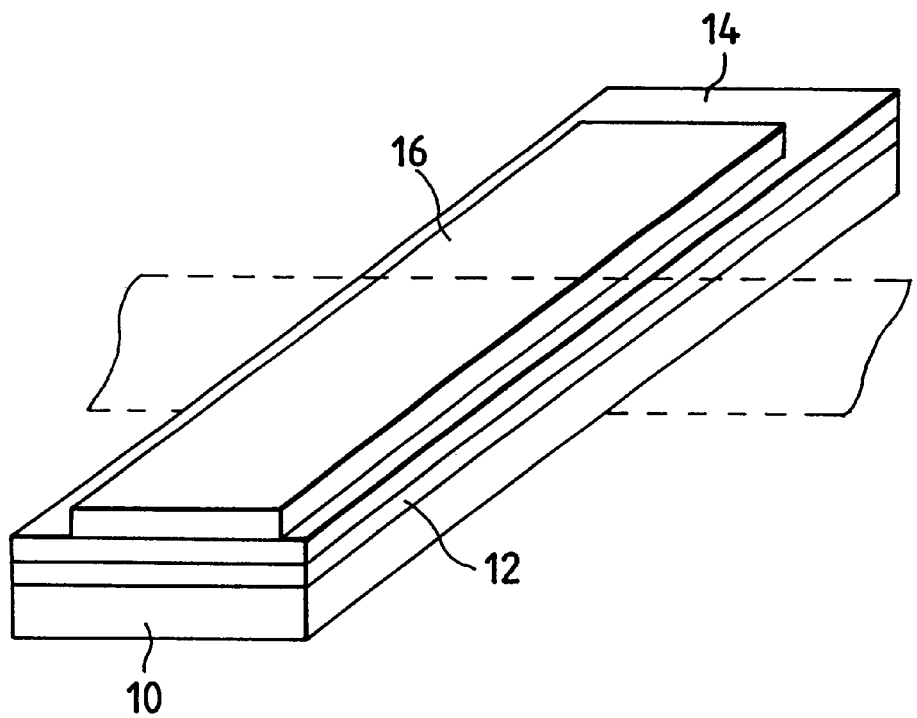
FIG. 1 is a schematic perspective view of a thin piezoelectric film element of the present invention which is used as an actuator (ink jet recording head)

In a preferred embodiment of the thin piezoelectric film element, the crystalline structure of the piezoelectric film is a rhombohedral system which is strongly oriented in either or both of (111) plane and (100) plane.

The crystalline structure of the piezoelectric film may be a tetragonal system which is strongly oriented in (001) plane.

A higher piezoelectric strain constant can be obtained by an arrangement such that the vertical width of the crystal grains is greater than the horizontal width of the crystal grains. Preferably, the relationship between the vertical width and the horizontal width of the crystal grains is from not less than 1/10 to not more than 1/3 as calculated in terms of the ratio of horizontal width to vertical width.

Preferably, the lower electrode is made of a compound of platinum with an oxide of the metal element constituting the piezoelectric film. In this arrangement, the adhesion between the piezoelectric film and the lower electrode can be enhanced. The foregoing oxide comprises at least one selected from the group consisting of titanium oxide, lead oxide, zirconium oxide, magnesium oxide and niobium oxide.

More preferably, the grain boundary of the crystalline constituting the lower electrode is formed almost perpendicular to the surface of the electrodes. The vertical width of the crystal grains of the crystalline constituting the lower electrode is greater than the horizontal width of the crystal grains. Further, the relationship between the vertical width and the horizontal width of the crystal grains of the crystalline constituting the lower electrode is from not less than 1/10 to not more than 1/3 as calculated in terms of the ratio of horizontal width to vertical width. In this arrangement, the substrate can be prevented from being warped or bent when subjected to heat treatment during the formation of the piezoelectric film.

The thin PZT film may be formed by sol-gel method or sputtering method. The piezoelectric film is made of a binary PZT or a tertiary PZT comprising the binary PZT having a third component incorporated therein. As the third component of thin PZT film there may be used, e.g., lead magnesium niobate if sol-gel method is used. In the thin PZT film comprising lead magnesium niobate as a third component, x in $Pb(Mg_{1/3}Nb_{2/3})_{0.2}Zr_xTi_{0.5-x}O_3$ is preferably from 0.35 to 0.45.

The present invention further provides a thin piezoelectric film element comprising a piezoelectric film made of a polycrystalline substance having a thickness of from 0.5 to 25 $\mu$m and two electrodes arranged with said piezoelectric film interposed therebetween, wherein said piezoelectric film has pores incorporated therein and said pores have an average diameter of not less than 0.01 $\mu$m and a surface density of not less than 0.3%, thereby preventing the thin piezoelectric film element from being cracked. Preferably, the pores have an average diameter of not more than 0.1 $\mu$m and a surface density of not more than 5%. These pores can be formed, e.g., when organic materials are evaporated away from the sol composition from which the thin PZT film is prepared during the gelation and heat treatment of the sol composition. In the case where the thin PZT film is formed by sputtering, these pores can be formed, e.g., by controlling the heating conditions described later and other conditions.

The present invention further provides a process for the preparation of a piezoelectric film element which comprises forming a thin PZT film comprising lead zircotitanate having a third component incorporated therein on a substrate having a metal film formed thereon, characterized in that the heat treatment temperature of said thin PZT film is from 800° C. to 1,000° C. if sol-gel method is used.

As previously mentioned, in order to make the crystalline structure of the thin piezoelectric film element columnar, a PZT precursor is sputtered onto the metal film formed on the substrate in an atmosphere free of oxygen. The composition of the PZT target to be used in this sputtering process is composed of $PbZrO_3$, $PbTiO_3$ and $Pb(A_gB_h)O_3$ which satisfy the following relationships:

$a+b+c=1$, $0.10 \leq a \leq 0.55$, $0.25 \leq b \leq 0.55$, $0 \leq c \leq 0.5$, supposing $PbZrO_3:PbTiO_3:Pb(A_gB_h)O_3=a:b:c$ (molar ratio) wherein A represents a divalent metal selected from the group consisting of Mg, Co, Zn, Cd, Mn and Ni or a trivalent metal selected from the group consisting of Y, Fe, Sc, Yb, Lu, In and Cr; and B represents a pentavalent metal selected from the group consisting of Nb, Ta and Sb or a hexavalent metal selected from the group consisting of W and Te, with the proviso that if A is a trivalent metal and B is not a hexavalent metal or if A is a divalent metal and B is a pentavalent metal, g is 1/3 and h is 2/3; and A and B are preferably Mg and Nb, respectively.

Preferably, a, b and c, if represented in mol-%, are present in a region surrounded by A', B', C', D', E' and F':

A': (45, 55, 0)

B': (50, 50, 0)

C': (25, 25, 50)

D': (10, 40, 50)

E': (10, 45, 45)

F': (35, 45, 20)

In other words, the PZT film constituting the foregoing piezoelectric film is composed of the foregoing components.

The present invention further provides an ink jet recording head comprising a substrate having an ink chamber formed therein, a vibrating plate sealing one end of said ink chamber and having a deflection vibration mode thin piezoelectric film element fixed on the surface thereof and a nozzle plate sealing the other end of said ink chamber and having an ink jetting nozzle port formed therein, characterized in that said thin piezoelectric film element is made of a novel and useful thin piezoelectric film element mentioned above.

The constitution and drawing of the embodiments of the present invention will be described optionally in connection with the drawings. The embodiments of the present invention will be described with reference to the case where PZT film is formed as a piezoelectric film.

I. Firstly, the structure of an example of the thin piezoelectric film element of the present invention will be described in connection with the drawings. The thin piezoelectric film element shown in FIG. 1 comprises a silicon (Si) substrate 10, a lower electrode (made of, e.g., Pt) 12, a piezoelectric film (e.g., binary PZT), and an upper electrode (made of, e.g., Pt) 16.

Figure 2:
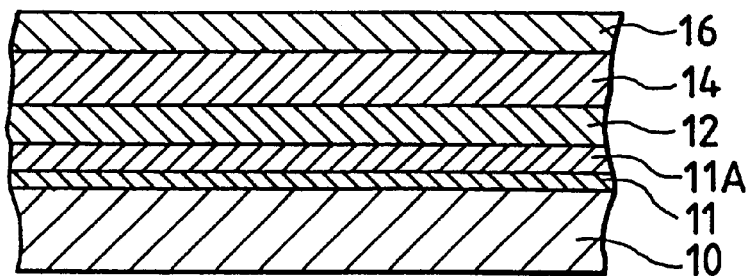
FIG. 2 is a detailed sectional view of the thin piezoelectric film element of FIG. 1.

FIG. 2 is a sectional view illustrating in more detail the structure of the thin piezoelectric film element. The thin piezoelectric film element is shown comprising a silicon substrate 10, a silicon oxide film 11 formed on the silicon substrate, a titanium oxide film 11A formed on the silicon oxide film, a lower electrode 12 formed on the titanium oxide film, a PZT film (piezoelectric film) formed on the lower electrode, and an upper electrode 16 formed on the PZT film.

In an arrangement such that the lower electrode is made of, e.g., platinum, the lattice constant of the lower electrode can be close to that of the PZT film to enhance the adhesion of the lower electrode with the PZT film to be formed later.

EXAMPLE 1

In Example 1, platinum was sputtered onto a silicon substrate 10 as a lower electrode 12. Subsequently, a thin piezoelectric film 14 was formed on the lower electrode 12 by sol-gel method. The sol was prepared as follows. 0.105 mol of lead acetate, 0.045 mol of zirconium acetyl acetonate and 0.005 mol of magnesium acetate were dissolved in 30 ml of acetic acid at a temperature of 100° C.

The sol was then allowed to cool to room temperature. To the sol was then added a solution of 0.040 mol of titanium tetraisopropoxide and 0.010 mol of pentaethoxy niobium in 50 ml of ethyl cellosolve. To the sol was then added 30 ml of acetyl acetone so that it was stabilized. To the sol was then added polyethylene glycol in an amount of 30% by weight based on the weight of the metal oxide in the sol. The mixture was then thoroughly stirred to make a homogeneous sol.

The sol thus prepared was then applied to the substrate having a lower electrode formed thereon by means of a spin coater. The material was then calcined at a temperature of 400° C. to form a thin amorphous porous gel film. The application of the sol and the calcining at a temperature of 400° C. were then repeated twice to form a thin porous gel film. During the heating, polyethylene glycol was evaporated from the sol to form pores.

In order to obtain a perovskite crystal, the material was heated to 650° C. in an oxygen atmosphere in an RTA (Raid Thermal Annealing) furnace in 5 seconds, and then remained at the same temperature for 1 minute so that it was pre-annealed to form a thin dense PZT film.

The sol was again applied to the material by means of a spin coater. The material was then calcined at a temperature of 400° C. This procedure was then repeated twice (thrice in total) to form a laminate of thin amorphous porous gel films. The material was pre-annealed at a temperature of 650° C. in RTA, and then maintained at the same temperature for 1 minute to obtain a thin dense crystalline film. The pre-annealing temperature can be predetermined to a range of from 400° C. to 800° C., preferably from 450° C. to 750° C., more preferably from 550° C. to 750° C. to unite the laminated thin porous films in a body.

The material was heated to various temperatures of 750° C., 800° C., 850° C., 900° C., 950° C., 1,000° C. and 1,050° C. in an oxygen atmosphere in RTA, and then maintained at the same temperatures for 1 minute so that it was annealed. As a result, a thin piezoelectric film 14 having a thickness of 1.0 μm was obtained.

The thin PZT film thus obtained was then subjected to X-ray diffractometry. For this measurement, RINT-1400 (available from Rigaku Denki Co., Ltd.) was used and the angle of incidence of X-ray from a copper valve tube was adjusted to 1°.

Figure 3:
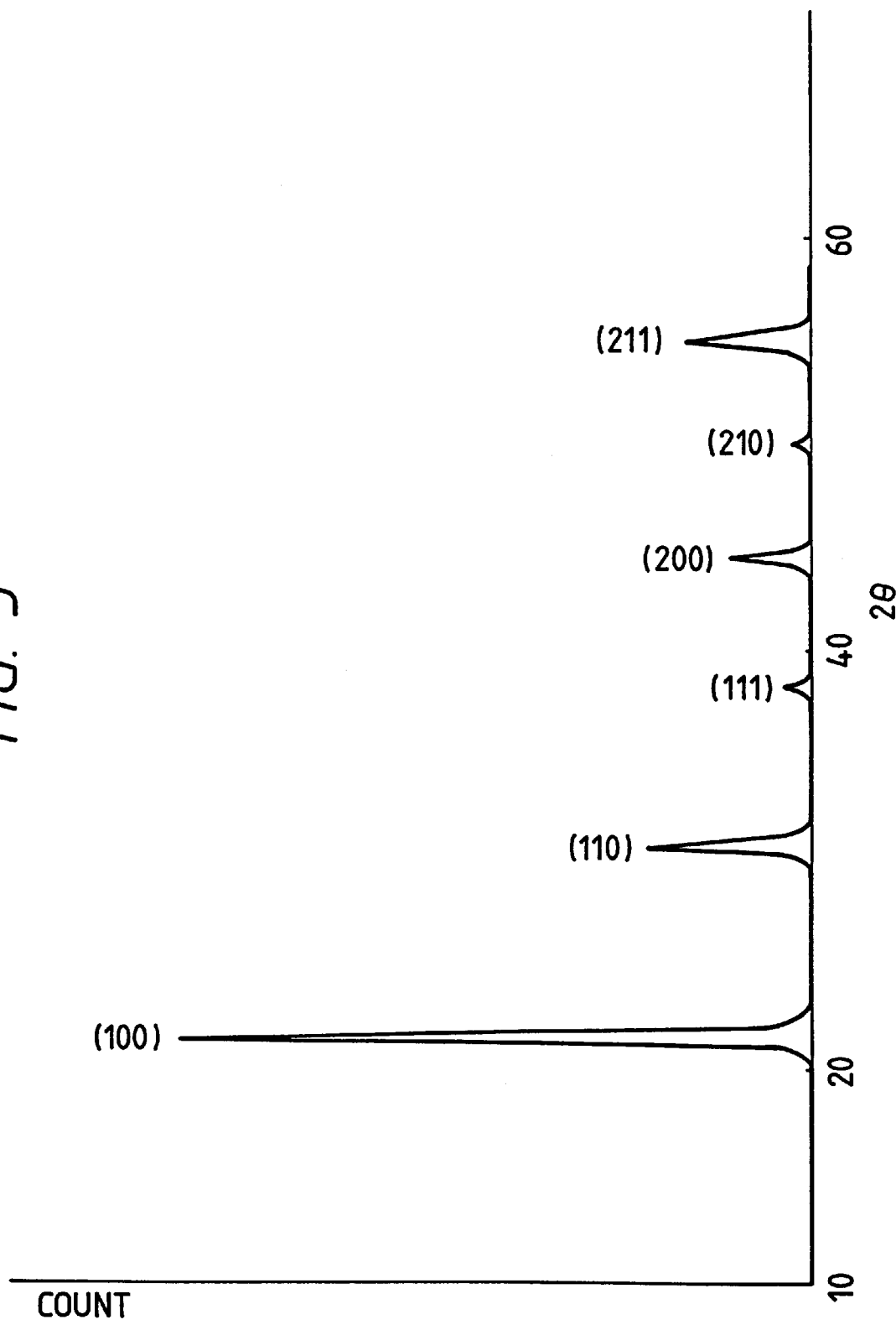
FIG. 3 is a characteristic view illustrating X-ray diffraction pattern of a thin PZT film annealed at 900° C.
Figure 4:
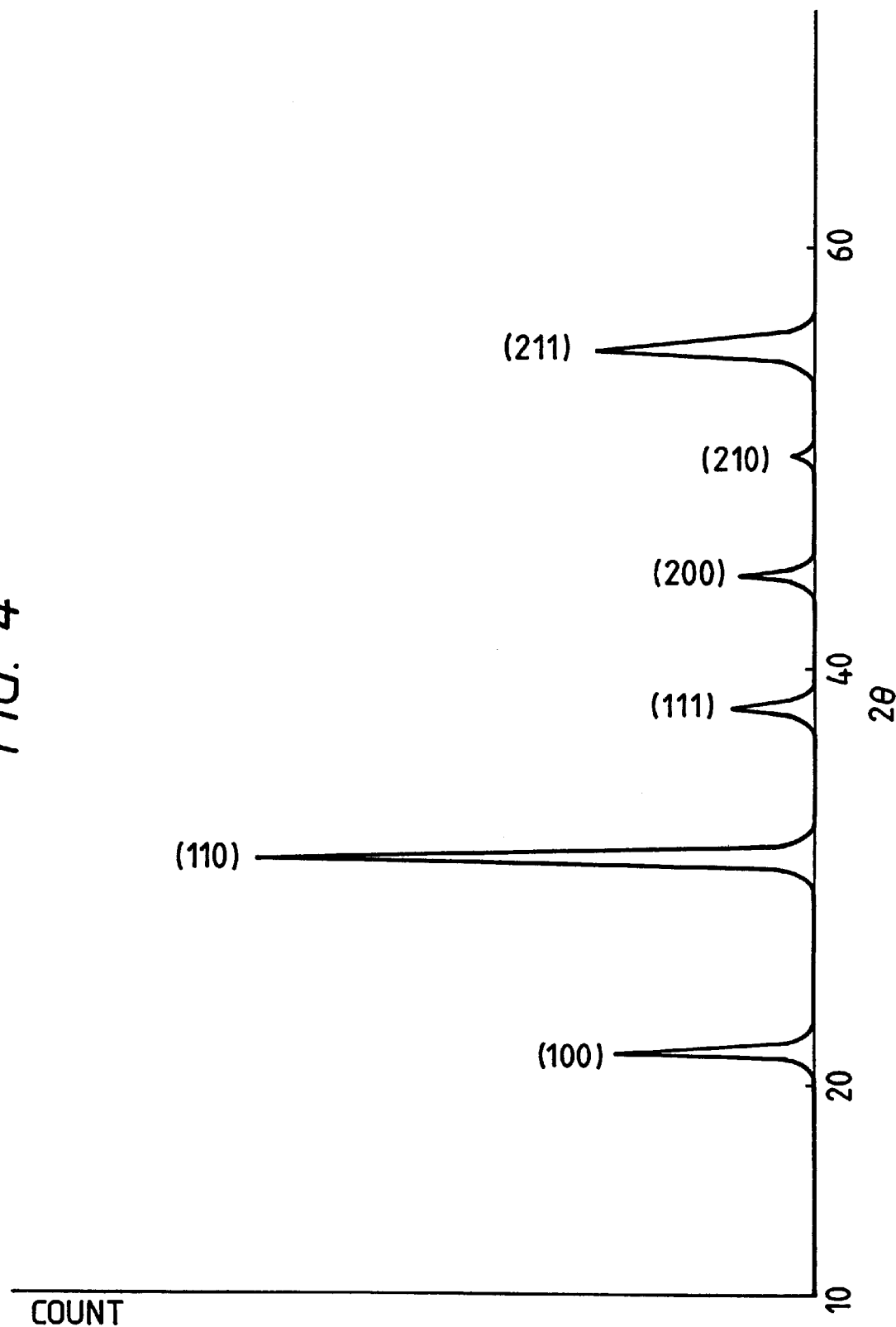
FIG. 4 is a characteristic view illustrating X-ray diffraction pattern of a thin PZT film annealed at 750° C.

FIG. 3 shows an X-ray diffraction pattern of the thin PZT film which had been annealed at a temperature of 900° C. FIG. 4 shows an X-ray diffraction pattern of the thin PZT film which had been annealed at a temperature of 750° C.

All the peaks in the X-ray diffraction pattern shown in FIGS. 3 and 4 are reflection peaks of PZT in the perovskite structure. This thin PZT film may be rhombohedral or tetragonal. Since the peaks corresponding to (100) plane, (110) plane, etc. are not separated from each other and together form one sharp peak, this thin PZT film is rhombohedral system crystalline structure.

An aluminum electrode was then evaporated on the thin piezoelectric film. With this arrangement, the piezoelectric constant d31 was measured. Table 1 shows the relationship of the annealing temperature with (100) orientation and piezoelectric constant d31.

The orientation in (100) plane (P(100)) is represented by the following formula:

$$P(100)=I(100)/\Sigma I(hkl)$$

wherein ΣI(hkl) represents the sum of diffraction intensities of PZT as determined at 2θ of from 20° to 60° with CuK α-ray by X-ray diffractometry.

However, (200) plane is a crystalline plane equivalent to (100) plane and thus is not included in ΣI(hkl). In some detail, ΣI(hkl) is the sum of the crystalline plane reflection intensities in (100), (110), (111), (210) and (211) planes. I(100) represents the crystalline plane reflection intensity of PZT in (100) plane.

TABLE 1

| Annealing temp. | P(100) | Piezoelectric constant d31 |
| --- | --- | --- |
| 750° C. | 18.7% | 61 pC/N |
| 800° C. | 31.5% | 90 pC/N |
| 850° C. | 55.7% | 132 pC/N |
| 900° C. | 64.5% | 123 pC/N |
| 950° C. | 52.0% | 120 pC/N |
| 1000° C. | 37.3% | 100 pC/N |
| 1050° C. | 14.0% | 88 pC/N |

The greater P(100) is, the greater is the piezoelectric constant d31. The resulting thin piezoelectric film element can better act as an actuator.

EXAMPLE 2

Gold was sputtered onto a silicon substrate as a lower electrode. Subsequently, a thin piezoelectric film element was formed on the lower electrode by sol-gel method. The sol was prepared as follows. In some detail, 0.105 mol of lead acetate, 0.030 mol of zirconium acetyl acetonate and 0.007 mol of magnesium acetate were dissolved in 30 ml of acetic acid at a temperature of 100° C.

The sol was then allowed to cool to room temperature. To the sol was then added a solution of 0.050 mol of titanium tetraisopropoxide and 0.013 mol of pentaethoxy niobium in 50 ml of ethyl cellosolve. To the sol was then added 30 ml of acetyl acetone so that it was stabilized. To the sol was then added polyethylene glycol in an amount of 30% by weight based on the metal oxide in the sol. The mixture was then thoroughly stirred to make a homogeneous sol (Zr/Ti=30/50).

Three other sols having different zirconium and titanium compositions were similarly prepared (0.035 mol of zirconium acetyl acetonate and 0.045 mol of titanium tetraisopropoxide (Zr/Ti=35/45); 0.040 mol of zirconium acetyl acetonate and 0.040 mol of titanium tetraisopropoxide (Zr/Ti=40/40); 0.045 mol of zirconium acetyl acetonate and 0.035 mol of titanium tetraisopropoxide (Zr/Ti=45/35)).

These sols were then subjected to laminating in the same manner as in Example 1 to prepare thin piezoelectric film elements which were then evaluated. Table 2 shows the relationship of Zr/Ti with (100) orientation and piezoelectric constant d31.

TABLE 2

| Zr/Ti | P(100) | Piezoelectric constant d31 |
| --- | --- | --- |
| 30/50 | 27.4% | 46 pC/N |
| 35/45 | 38.2% | 100 pC/N |
| 40/40 | 66.7% | 128 pC/N |
| 45/35 | 60.6% | 137 pC/N |
| 50/30 | 25.3% | 51 pC/N |

The greater P(100) is, the greater is the piezoelectric constant d31, as in Example 1. The resulting thin piezoelectric film element can better act as an actuator.

Examples 1 and 2 have been described with reference to the case where the lower electrode is made of Pt or Au. However, any other metal such as Au, Pt—Ir, Pt—Pd, Pt—Ni and Pt—Ti may be used so far as (100) orientation of thin PZT film is not less than 30%.

Examples 1 and 2 have also been described with reference to the case where lead magnesium niobate is used as a third component. However, any other material such as lead nickel niobate and lead cobalt niobate may be used so far as (100) orientation of thin piezoelectric film element is not less than 30%. Nb, La, Mo, W, Ba, Sr, Bi, etc. may be contained as impurities.

Figure 5A:
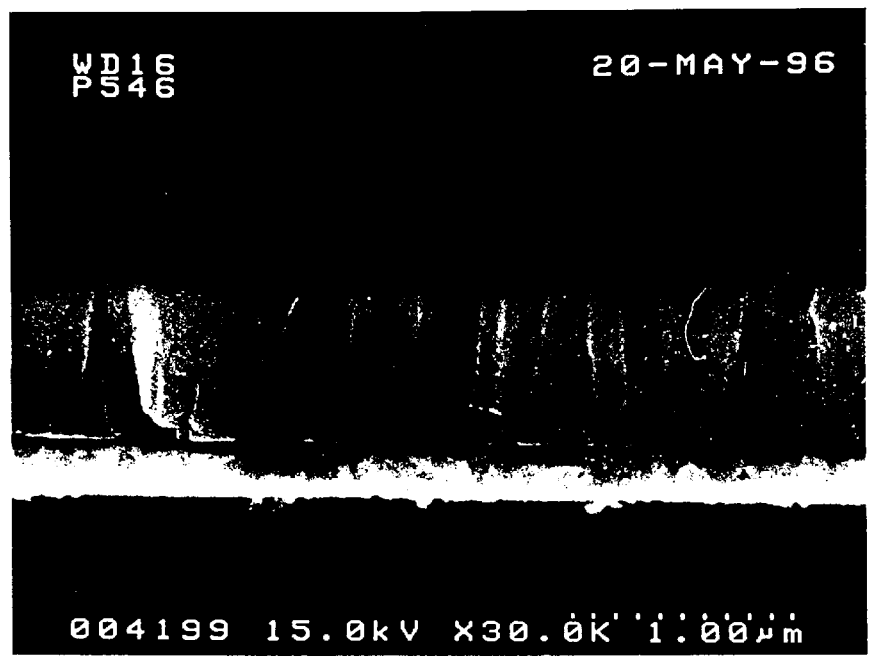
FIG. 5(A) is a scanning electron microscope (SEM) photograph of a section of a PZT film made of a columnar crystal constituting a thin piezoelectric film element of the present invention.
Figure 5B:
FIG. 5(B) is a scanning electron microscope photograph of the plane of the PZT film.

II. A piezoelectric element comprising a thin piezoelectric film having crystal grains formed almost perpendicular to the surface of electrode will be described. FIG. 5(A) is a scanning electron microscope photograph (SEM) of a section of the PZT film constituting the thin piezoelectric film element. FIG. 5(B) is a scanning electron microscope photograph of the plane of the PZT film shown in FIG. 5(A).

The PZT film shown in FIGS. 1 and 2 is made of a polycrystalline substance. The grain boundary of the crystalline exists almost perpendicular to the plane of the upper and lower electrodes as shown in FIG. 5. Shown white in the central portion of FIG. 5 is a PZT film. The PZT film is shown comprising columnar crystal grains extending vertically as viewed on the paper. A lower electrode is shown as a white layer under the PZT film. $SiO_2$ is shown provided under the lower electrode. The grain boundary of crystalline is the border of adjacent crystal grains. The crystal grain is a crystal having a perovskite structure while the crystal grain boundary is composed of an amorphous material.

In the crystalline, the vertical width (Y direction in FIG. 5) of the crystal grains is greater than the horizontal width (X direction in FIG. 5) of the crystal grains. The relationship between the vertical width and the horizontal width of the crystal grains is from not less than 1/10 to not more than 1/3 as calculated in terms of the ratio of horizontal width to vertical width.

Further, the crystalline structure of the PZT film is a rhombohedron which is strongly oriented in (111) plane. The term "orientation" as used herein is defined as follows:

$$I(XYZ)/\{I(100)+I(110)+I(111)\}$$

wherein I(XYZ) represents the reflection intensity of (XYZ) plane of PZT as determined by wide angle XRD method.

The relationship between (111) orientation and piezoelectric strain constant is as follows:

| (111) orientation | Piezoelectric strain constant |
|---|---|
| 50% | 80 pC/N |
| 70% | 120 pC/N |
| 90% | 150 pC/N |

In Examples 1 and 2, it was described that (100) orientation is preferably 30%. As made obvious herein, when (111) orientation is not less than 50%, the resulting piezoelectric strain constants are similar to that of Examples 1 and 2, providing desired piezoelectric characteristics.

The piezoelectric strain constant is proportional to the product of dielectric constant and piezoelectric output coefficient. The dielectric constant increases as the size of the crystal grains in the direction of electric field application (Y direction in FIG. 5) increases. The piezoelectric output coefficient increases as the size of the crystal grains increases in the horizontal direction (X direction in FIG. 5) and the width of the crystal grain boundary decreases. For this reason, the PZT film 15 having such a structure shows an enhanced piezoelectric strain constant.

For this reason, the ratio of the horizontal width of the crystal constituting the thin piezoelectric film to the vertical width of the crystal constituting the thin piezoelectric film is predetermined to a range of from not less than 1/10 to not more than 1/3, preferably from not less than 1/8 to not more than 3/10, more preferably from not less than 1/6 to not more than 3/11.

The PZT film is preferably made of a binary PZT or a tertiary PZT comprising such a binary PZT having a third component incorporated therein as a main component. Specific preferred examples of the binary PZT, if sol-gel method is used to form PZT film, include a compound having the an composition represented by the following chemical formula:

$$Pb(Zr_xTi_{1-x})O_3 + YPbO$$

wherein x is a number of from not less than 0.40 to not more than 0.6; and Y is a number of from not less than 0 to not more than 0.1.

An example of the binary PZT film formed by sputtering is a compound having the composition represented by the following chemical formula:

$$Pb(Zr_xTi_{1-x})O_3 + YPbO$$

wherein x is a number of from not less than 0.40 to not more than 0.6; and Y is a number of from not less than 0 to not more than 0.3.

A specific preferred example of the tertiary PZT, if sputtering is used, is a compound obtained by adding a third component (preferably lead magnesium niobate) to the foregoing binary PZT, having the composition represented by the following general formula:

$$PbTi_bZr_a(A_gB_h)_cO_3 + ePbO + (fMgO)_n \qquad (I)$$

wherein A represents a divalent metal selected from the group consisting of Mg, Co, Zn, Cd, Mn and Ni or a trivalent metal selected from the group consisting of Y, Fe, Sc, Yb, Lu, In and Cr; B represents a pentavalent metal selected from the group consisting of Nb, Ta and Sb or a hexavalent metal selected from the group consisting of W and Te; and a, b and c, if represented in molar ratio, satisfy the following relationships:

a+b+c=1,
$0.10 \leq a \leq 0.55$,
$0.25 \leq b \leq 0.55$,
$0 \leq c \leq 0.5$,
$0 \leq e \leq 0.3$,
$0 \leq f \leq 0.15c$,
g=h=1/2,
n=0, with the proviso that if A is a trivalent metal and B is not a hexavalent metal or if A is a divalent metal and B is a pentavalent metal, g is 1/3 and h is 2/3, and n is 1 when A is Mg and B is Nb.

A specific preferred example of the tertiary PZT is lead magnesium niobate wherein A is Mg, B is Nb, g is 1/3, and h is 2/3.

The PZT film comprising lead magnesium niobate incorporated therein as a third component, if sol-gel method is used, is represented, e.g., by the composition formula $$Pb(mg_{1/3}Nb_{2/3})_{0.2}Zr_xTi_{0.8-x}O_3$$

wherein x represents a number of from 0.35 to 0.45.

The PZT film, binary or tertiary, may comprise a slight amount of Ba, Sr, La, Nd, Nb, Ta, Sb, Bi, W, Mo, Ca, etc.

incorporated therein to have improved piezoelectric characteristics. In particular, the tertiary PZT preferably comprises Sr or Ba incorporated therein in an amount of not more than 0.10 mol-% to have improved piezoelectric characteristics. Further, the tertiary PZT preferably comprises Mn or Ni incorporated therein in an amount of not more than 0.10 mol-% to have improved sinterability. The third component may be partly replaced by a fourth component. In this case, as the fourth component there may be used one of the foregoing third components.

The PZT film may be strongly oriented in (100) plane or either (111) plane or (100) plane besides the foregoing planes. The crystalline structure of the PZT film is a tetragonal which is strongly oriented in (001) plane.

EXAMPLE 3

Figure 6A:
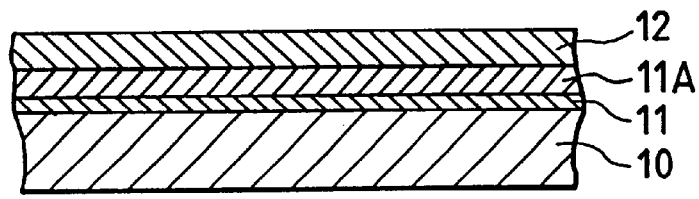
FIGS. 6 (a) to 6 (c) are sectional views illustrating various steps in the process for the preparation of the thin piezoelectric film element of FIG. 5.
Figure 6B:
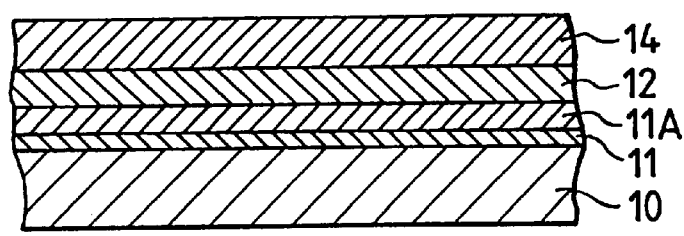
Figure 6C:
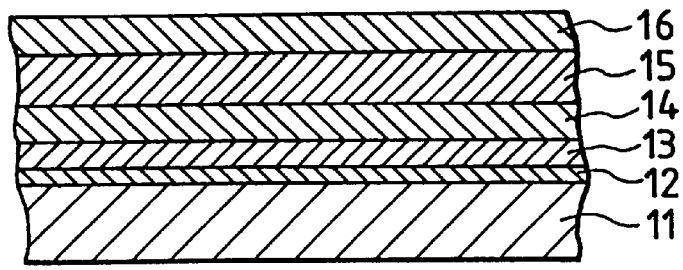

The process for the preparation of the thin piezoelectric film element having the foregoing structure will be described in connection with the drawings. FIGS. 6 (a) to (c) are sectional views illustrating the various steps in the process for the preparation of the foregoing thin piezoelectric film element.

In the step shown in FIG. 6 (*a*), a silicon substrate is subjected to thermal oxidation to form a silicon oxide film 11 thereon to a thickness of from about 0.3 to 1.2 μm. Subsequently, a titanium oxide film 11A was formed on the silicon oxide film to a thickness of from about 0.005 to 0.04 μm by sputtering method.

Subsequently, a lower electrode 12 made of platinum was formed on the titanium oxide film to a thickness of from about 0.2 to 0.8 μm. In the step shown in FIG. 6 (*b*), a PZT film 14 was formed on the lower electrode formed in the step shown in FIG. 6 (*a*) to a thickness of from about 0.5 to 3.0 μm. The process for the preparation of PZT film will be described with reference to sputtering method and sol-gel method.

EXAMPLE 3-1
Preparation of PZT Film by Sputtering Method

A PZT precursor film made of amorphous or pyrochlore phase was formed on a substrate by RF magnetron sputtering method with a sintered PZT having a specific composition as a sputtering target at a substrate temperature of not higher than 200° C. in a 100% Ar gas atmosphere.

Subsequently, the precursor film was heated so that it was crystallized and sintered. The heating is preferably effected by two stages in an atmosphere of oxygen (e.g., oxygen or a mixture of oxygen and an inert gas such as argon).

In other words, in the first heating step, the amorphous precursor film was heated to a temperature of from 500° C. to 700° C. in an atmosphere of oxygen so that it was crystallized. The first heating step may be completed at the time when the precursor film is uniformly crystallized.

Subsequently, in the second heating step, the crystal grains thus produced were allowed to grow, and the sintering of the crystal grains to each other was accelerated. In some detail, the precursor film which had been crystallized in the first heating step was heat to a temperature of from 750° C. to 1,200° C. The heating was effected until the grain boundary of the crystalline is present almost perpendicular to the surface of the lower electrode 14 and the relationship between the vertical width and the horizontal width of the crystal grains is from not less than 1/10 to not more than 1/3 as calculated in terms of the ratio of horizontal width to vertical width.

In this manner, on the lower electrode was formed a PZT film made of a polycrystalline substance wherein the grain boundary is present almost perpendicular to the surface of the lower electrode (Y direction in FIG. 5), the vertical (Y direction in FIG. 5) width of the crystal grains is greater than the horizontal (X direction) width of the crystal grains, and the relationship between the vertical width and the horizontal width of the crystal grains is from not less than 1/10 to not more than 1/3 as calculated in terms of the ratio of horizontal width to vertical width.

The first heating step may be immediately followed by the second heating step. Alternatively, the first heating step may be followed by cooling to room temperature which is in turn followed by the second heating step.

In the first and second heating steps, any heating furnace may be used so far as the PZT film 15 is formed by the precursor film having the foregoing structure. A heating furnace having a great temperature rising rate is preferably used. For example, a lamp annealing furnace is preferably used. In the first and second heating steps, the temperature rising rate is preferably not less than 50° C./sec., more preferably not less than 100° C./sec.

Figure 7:
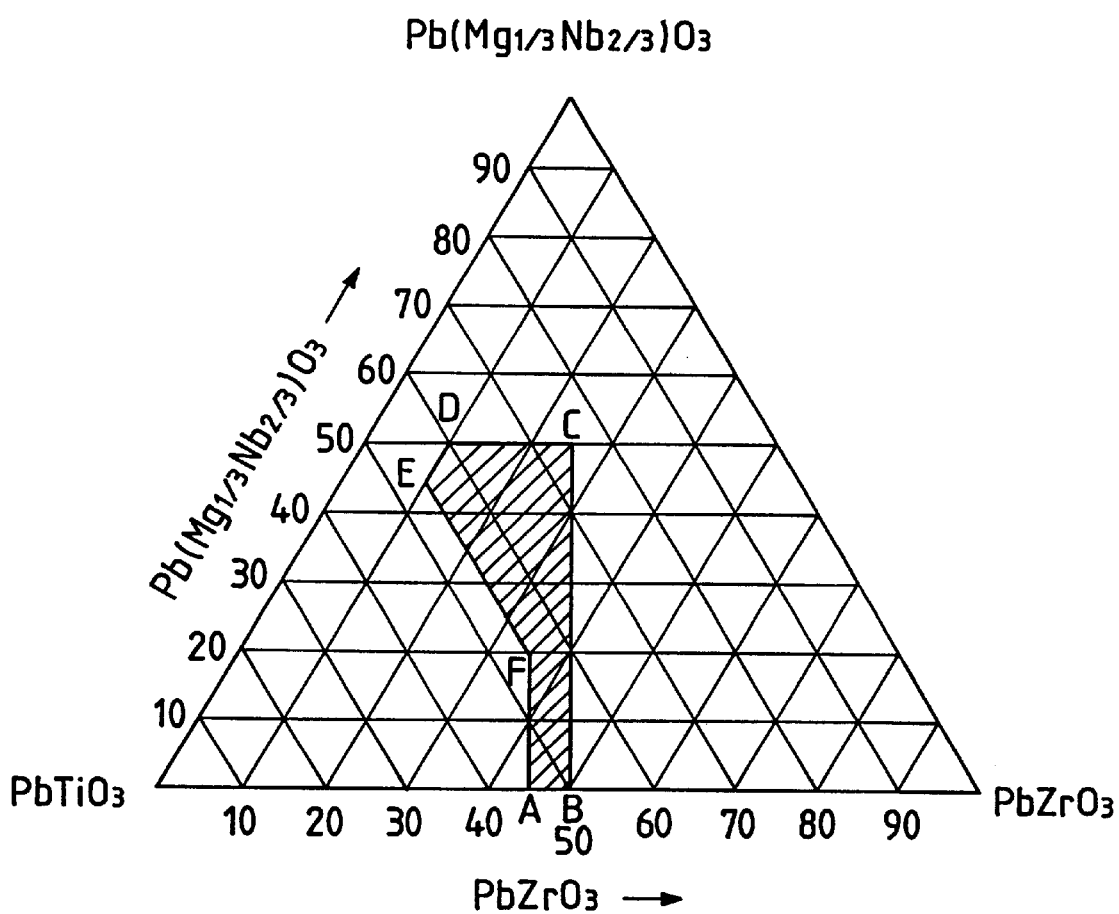
FIG. 7 is a characteristic view illustrating the composition of the thin piezoelectric film element of FIG. 5.

FIG. 7 shows a preferred composition range of PZT film (or PZT target) in the case where a PZT precursor film is formed by sputtering method. In this case, as the third component there is used Pb(Mg$_{1/3}$Nb$_{2/3}$)O$_3$ among those represented by the foregoing general formula (I): Pb(A$_g$B$_h$)O$_3$. This composition range corresponds to the region surrounded by A, B, C, D, E and F in FIG. 7.

Supposing PbZrO$_3$:PbTiO$_3$:Pb(Mg$_{1/3}$Nb$_{2/3}$)O$_3$=a:b: c, a, b and c, if represented in mol-%, are present in a region surrounded by A', B', C', D', E' and F':

A': (45, 55 0)

B': (50, 50, 0)

C': (25, 25, 50)

D': (10, 40, 50)

E': (10, 45, 45)

F': (35, 45, 20)

In other words, a is from not less than 10 to not more than 50, b is from not less than 20 to not more than 55, and c is from not less than 0 to not more than 50. This range is a preferred range included in the range defined with reference to the general formula (I).

The significance of the definition of the border (C-B) shown right in FIG. 7 will be described hereinafter.

It was found that if the content of PbTiO$_3$ is greater than that of PbZrO$_3$, a columnar film can be fairly formed by sputtering.

Figure 15:
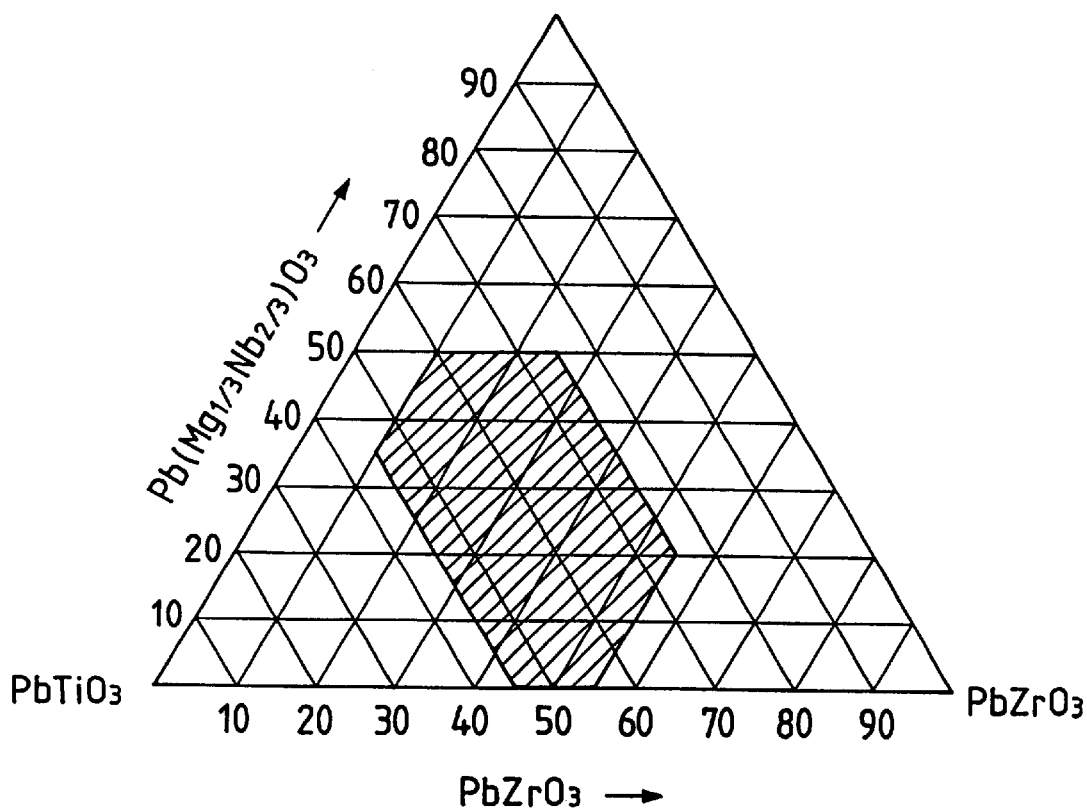
FIG. 15 is a diagram illustrating the region of the composition represented by the general formula (I) shown below.

Further, the border (D-E-F-A) shown left in FIG. 7 is defined to obtain a high piezoelectric strain constant (not less than 100 pC/N). Moreover, the border (D-C) shown upper in FIG. 7 is defined to avoid a fear that the stability of the device may be deteriorated when the Curie temperature is close to room temperature. When the Curie temperature is exceeded, the piezoelectric element cannot fully exhibit its piezoelectric characteristics. Further, the region of the composition represented by the foregoing formula (I) is shown in FIG. 15.

EXAMPLE 3-2
Preparation of PZT Film by Sol-gel Method

This preparation process comprises dehydrating a hydrated-complex of a hydroxide of a metal component capable of forming a PZT film, i.e., sol to make a gel which is then calcined to prepare an inorganic oxide. Two such preparation processes will be described. These sol-gel methods are almost the same as Examples 1 and 2 but will be again described in detail.

(Process 1)

a. Step of forming sol composition into film

In an embodiment of the present invention, the sol of the metal component constituting the PZT film can be prepared by hydrolyzing an alkoxide or acetate of a metal capable of forming a PZT film with, e.g., an acid. In the present invention, the composition of the metals in the sol can be controlled to obtain the foregoing composition of the PZT film. In other words, an alkoxide or acetate of titanium, zirconium, lead or other metal components may be used as a starting material.

The present example is advantageous in that the composition of the metal components constituting the PZT film is almost maintained until it is finally formed into a PZT film (thin piezoelectric film). In other words, there arises an extremely small change in the metal content, particularly lead content, due to evaporation during calcining and annealing. Accordingly, the composition of the metal components in the starting material coincides with that of the metal components in the PZT film finally obtained. In other words, the composition of the desired gel is determined depending on the piezoelectric film to be produced (PZT film in the present example).

In the present example, in order to obtain a PZT film having excess content of the foregoing lead component, it is preferred that the sol contains the lead component in an amount of 20 mol-%, preferably 15 mol-% more than the value stoichiometrically required.

In the present example, the sol is preferably used in the form of a composition mixed with an organic high molecular compound. This organic high molecular compound absorbs residual stress of the thin film during drying and calcining to effectively prevent the thin film from being cracked. In some detail, the use of a gel containing this organic high molecular compound makes it possible to form pores in the gelated thin film described later. It is thought that these pores absorb residual stress of the thin film during the pre-annealing step and annealing step described later.

Examples of the organic high molecular compound which may be preferably used in the present invention include polyvinyl acetate, hydroxypropyl cellulose, polyethylene glycol, polyethylene glycol monomethyl ether, polypropylene glycol, polyvinyl alcohol, polyacrylic acid, polyamide, polyamino acid, acetyl cellulose and derivative thereof, and copolymer thereof.

In the present example, the incorporation of polyvinyl acetate makes it possible to form a thin porous gel film having many pores with a diameter of about 0.05 $\mu m\phi$ formed therein. Further, the incorporation of hydroxypropyl cellulose makes it possible to form a thin porous gel film having pores with a size of not more than 0.1 $\mu m$ and a wide distribution formed therein.

In the present example, as the polyethylene glycol there may be preferably used one having an average molecular weight of from about 285 to 420. As the polypropylene glycol there may be preferably used one having an average molecular weight of from about 300 to 800.

In the preparation process according to the present example, this sol composition is applied to a lower electrode on which a PZT film is to be formed (see FIG. 6 (b)). The coating method is not specifically limited. Any common method such as spin coating method, dip coating method, roll coating method and bar coating method may be used. Alternatively, any printing method such as flexography, screen printing and offset printing may be used.

The thickness of the film thus formed by coating is preferably controlled such that the thickness of the thin porous gel film formed in the gelation step described later reaches not less than 0.01 $\mu m$, more preferably from 0.1 to 1 $\mu m$, taking into account the subsequent steps.

Subsequently, the sol composition thus applied is spontaneously dried or heated to a temperature of not higher than 200° C. The sol composition may be further applied to the film thus dried (heated) to add to the thickness of the film. In this case, the film to which the sol composition is further added is preferably dried at a temperature of not lower than 80° C.

b. Step of gelling the film of sol composition

Subsequently, the film obtained in the foregoing step of forming a sol composition into a film is calcined to form a thin porous gel film made of an amorphous metal oxide substantially free of residual organic substances.

The calcining is effected at a temperature high enough to gel the film of sol composition and remove organic substances from the film for a period of time long enough to do so.

In the present example, the calcining temperature is preferably from 300° C. to 450° C., more preferably from 350° C. to 400° C. The calcining time depends on the temperature and the type of the furnace used but preferably is from about 10 to 120 minutes, more preferably from about 15 to 60 minutes, if a degreasing furnace is used. Further, if a hot plate is used, the calcining time is preferably from about 1 to 60 minutes, more preferably from about 5 to 30 minutes. In this manner, a thin porous gel film was formed on the lower electrode.

c. Pre-annealing step

Subsequently, the thin porous gel film obtained in the foregoing step b is heated and calcined so that it is converted to a film made of a crystalline metal oxide. The calcining is effected at a temperature required to convert the thin porous gel film to a film made of a crystalline metal oxide. However, the calcining doesn't need to be effected until perovskite accounts for the majority of the crystal. The calcining may be completed at the time when the thin gel film is uniformly crystallized.

In the present example, the calcining temperature is preferably from 400° C. to 800° C., more preferably from 550° C. to 750° C. The calcining time depends on the calcining temperature and the type of the furnace used but preferably is from about 0.1 to 5 hours, more preferably from about 0.5 to 2 hours, if an annealing furnace is used. Further, if RTA (Rapid Thermal Annealing) furnace is used, the calcining time is preferably from 0.1 to 10 minutes, more preferably from 1 to 5 minutes.

In the present example, the pre-annealing step is effected by two stages. In some detail, pre-annealing is effected at a temperature of from 400° C. to 600° C. at a first step, and then at a temperature of from 600° C. to 800° C. at a second step. More preferably, pre-annealing is effected at a temperature of from 450° C. to 550° C. at a first step, and then at a temperature of from 600° C. to 750° C. at a second step. In this step, the thin porous gel film was converted to a film made of a crystalline metal oxide.

d. Repeating step

Subsequently, the foregoing steps a, b and c are repeated at least once to obtain a laminate of crystalline gold oxides. The thickness of the films obtained in this repeating step, the calcining temperature in this repeating step and the pre-annealing conditions used in this repeating step are the same as used in the formation of the first film on the lower electrode.

The thickness of the laminate obtained in this repeating step may be properly determined taking into account the thickness of PZT film finally formed but is preferably such that no cracking occurs during the subsequent step described later (step e).

In this repeating step, a new thin porous gel film was formed on the film previously formed, and then pre-annealed. As a result, the newly formed thin porous gel film was substantially integrated with the film previously formed.

The substantially integrated film may or may not be free of discontinuous layer between laminated layers unlike the finally obtained PZT film 15 according to the present example. If the steps a, b and c are further repeated, a further new thin porous gel film is formed, followed by pre-annealing. As a result, the new thin porous gel film was substantially integrated with the laminate of crystalline films previously obtained.

The patterning for forming a thin piezoelectric film element or the formation of the upper electrode is preferably effected at this step.

e. Step of allowing perovskite to grow

Subsequently, the film obtained in the step d is annealed at a calcining temperature of from 600° C. to 1,200° C., preferably from 800° C. to 1,000° C. The calcining time depends on the calcining temperature or the type of the furnace used but preferably is from about 0.1 to 5 hours, more preferably from 0.5 to 2 hours, if an annealing furnace is used. Further, if RTA furnace is used, the calcining time is preferably from 0.1 to 10 minutes, more preferably from 0.5 to 3 minutes.

This perovskite growth step, i.e., annealing may be effected by two stages. In some detail, annealing may be effected at a temperature of from about 600° C. to 800° C. at a first step, and then at a temperature of from about 800° C. to 1,000° C. at a second step. More preferably, annealing may be effected at a temperature of from about 600° C. to 750° C. at a first step, and then at a temperature of from about 800° C. to 950° C. at a second step.

In this manner, on the lower electrode 14 was formed a PZT film 15 made of a polycrystalline substance the grain boundary is present almost perpendicular to the surface of the lower electrode 14, the vertical width of the crystal grains is greater than the horizontal width of the crystal grains, and the relationship between the vertical width and the horizontal width of the crystal grains is from not less than 1/10 to not more than 1/3 as calculated in terms of the ratio of horizontal width to vertical width.

(Process 2)

Another process for the preparation of a thin piezoelectric film element using sol-gel method will be described hereinafter.

f. Step of forming thin porous gel film

The foregoing steps a and b are repeated at least once to form a laminate of thin porous gel films. The thickness of the film formed in the steps a and b and the calcining temperature are proportionate to the foregoing preparation process (1).

In the present example, the thickness of the laminate is preferably determined to not more than 1 μm, more preferably not more than 0.5 μm. The definition of the thickness of the laminate to this range makes it possible to prevent the laminate from being cracked during pre-annealing at the subsequent step (step c'). In this step, a laminate of a plurality of thin porous gel films was obtained.

c'. Pre-annealing step

Subsequently, the laminate obtained at the step f is calcined to convert the laminate to a film made of a crystalline metal oxide. This calcining is effected at a temperature required to convert the laminate to a film made of a crystalline metal oxide. The calcining doesn't need to be effected until perovskite accounts for the majority of the crystal but may be completed at the time when the thin gel film is uniformly crystallized. The calcining temperature and time may be almost the same as the step c. Further, this calcining may be effected by two stages as in the step c. In this step, the laminate of a plurality of thin polycrystalline gel films was converted to a thin crystalline film.

d'. Repeating step

Subsequently, the steps f and c' are repeated at least once. In other words, in this step, the steps a and b are repeated at least once to form a laminate of thin porous gel films which is then calcined to convert it to a film made of a crystalline metal oxide. This step is further repeated once or more times. In this manner, a laminate of a plurality of crystalline metal oxide films is formed. The various conditions used in the repeated steps a, b and c' are the same as mentioned above.

The thickness of the laminate obtained in this repeating step d' may be properly determined taking into account the thickness of PZT film 15 finally formed but is preferably such that no cracking occurs during the subsequent step described later (step e').

In this repeating step, a new thin porous gel film was formed on the film previously formed, and then pre-annealed. As a result, the newly formed thin porous gel film was substantially integrated with the film previously formed. The substantially integrated film is defined as mentioned above.

The patterning for forming a thin piezoelectric film element or the formation of the upper electrode 16 is preferably effected at this step.

Subsequently, the step c was effected. As a result, on the lower electrode 14 was formed a PZT film made of a polycrystalline substance the grain boundary is present almost perpendicular to the surface of the lower electrode 14, the vertical width of the crystal grains is greater than the horizontal width of the crystal grains, and the relationship between the vertical width and the horizontal width of the crystal grains is from not less than 1/10 to not more than 1/3 as calculated in terms of the ratio of horizontal width to vertical width.

Subsequently, in the step shown in FIG. 6 (c), aluminum is sputtered onto the PZT film obtained in the step shown in FIG. 6 (b) to form an upper electrode 16 to a thickness of from about 0.2 to 1.0 μm.

In this manner, a thin piezoelectric film element shown in FIG. 2 was obtained. The PZT film 14 thus obtained was found to have no cracking. The PZT film was also found to have no laminated discontinuous planes present in a section.

EXAMPLE 4

The thin piezoelectric film element according to Example 3 (Invention 1) and a thin piezoelectric film element having the same structure as Invention 1 except that the grain boundary of the crystalline constituting the PZT film is not present almost perpendicular to the surface of the lower electrode (Comparison 1) were measured for piezoelectric strain constant (pC/N). As a result, the piezoelectric strain constant of Invention 1 was 150 pC/N. The piezoelectric strain constant of Comparison 1 was 100 pC/N.

Figure 8:
FIG. 8 is a scanning electron microscope photograph of a section of a PZT film constituting Comparison 1.
Figure 9:
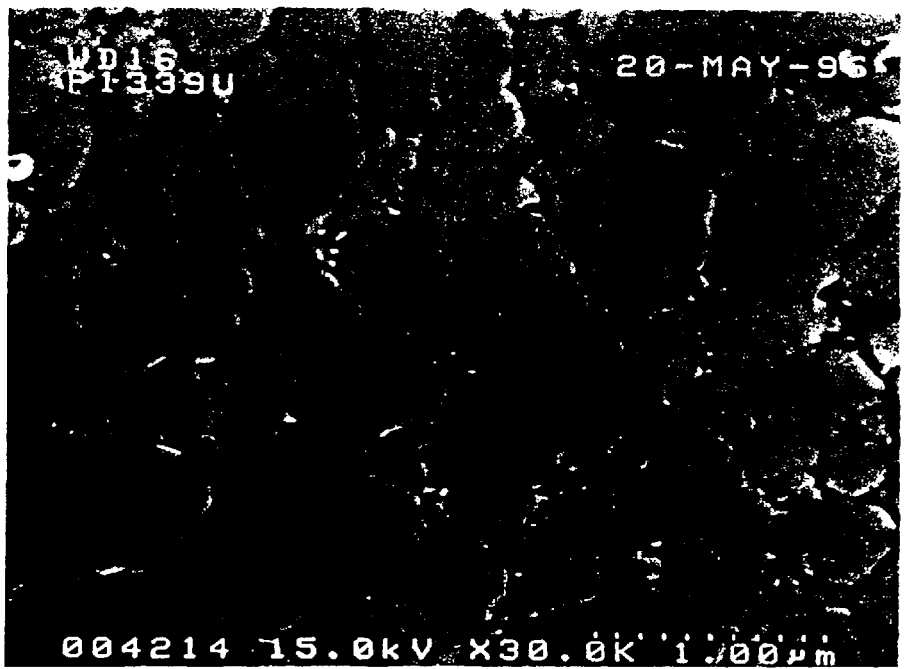
FIG. 9 is a scanning electron microscope photograph of the plane of the PZT film of FIG. 8.

As a result, it was confirmed that Invention 1 exhibits a higher piezoelectric strain constant than Comparison 1. For the measurement of piezoelectric strain constant, the specimen (2 mmφ dot pattern) was measured for dielectric constant by means of an impedance analyzer and for piezoelectric output coefficient (voltage generated on the dot pattern when the free end of a cantilever is under load). The piezoelectric strain constant was calculated by the product of dielectric constant and piezoelectric output coefficient. A SEM photograph illustrating a section of the PZT film in Comparison 1 is shown in FIG. 8. A SEM photograph illustrating the plane of the PZT film of FIG. 8 is shown in FIG. 9. Invention 1 showed little warping or distortion and hence a good external appearance.

Example 3 has been described with reference to the case where PZT film is prepared by sputtering method or sol-gel method. It goes without saying that the present invention is not limited to this case and other preparation processes may be used so far as a PZT film having such a structure that the grain boundary of the crystalline exists almost perpendicular to the surface of the lower electrode can be formed.

Further, Example 3 has been described with reference to the PZT film wherein the grain boundary of the crystalline is present almost perpendicular to the surface of the electrode, the vertical width of the crystal grains is greater than the horizontal width of the crystal grains and the relationship between the vertical width and the horizontal width of the crystal grains is from not less than 1/10 to not more than 1/3 as calculated in terms of the ratio of horizontal width to vertical width. However, any PZT film may be used so far as the grain boundary of the crystalline is present almost perpendicular to the surface of the electrode.

EXAMPLE 5

Figure 10:
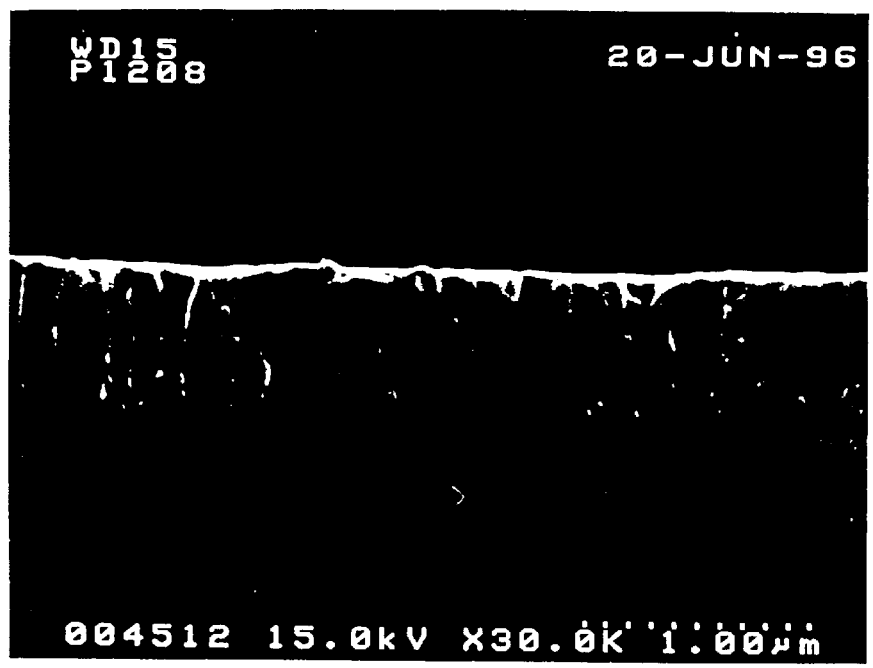
FIG. 10 is a scanning electron microscope photograph of a section of a lower electrode made of a columnar crystal constituting a thin piezoelectric film element.

FIG. 10 is a scanning electron microscope (SEM) photograph illustrating a section of a lower electrode constituting another embodiment of the thin piezoelectric film element. In the present example, the difference from Example 4 will be described. Like reference numerals are used and detailed description is omitted where the constitutions and steps are the same as those of Example 3.

The thin piezoelectric film element according to the present example differs from that of Example 3 in the structure and preparation process of the lower electrode. In other words, the lower electrode of the thin piezoelectric film element according to the present example is made of a compound of platinum with titanium oxide (platinum: 99% by weight; titanium oxide: 1% by weight). Further, the lower electrode has such a structure that the grain boundary of the crystalline is present almost perpendicular to the surface of the substrate as shown in FIG. 10.

In the crystalline constituting the lower electrode, the grain boundary is present almost perpendicular to the surface of the PZT film and the relationship between the vertical width and the horizontal width of the crystal grains is from not less than 1/10 to not more than 1/3 as calculated in terms of the ratio of horizontal width to vertical width.

The lower electrode having such a structure can prevent the substrate from being warped or distorted during heat treatment in the formation of PZT film because titanium oxide can inhibit the shrinkage of platinum. Further, the lower electrode having such a structure can have an enhanced adhesion with the PZT film and titanium oxide film.

The process for the preparation of the lower electrode having such a structure will be described.

A silicon oxide film 11 and a titanium oxide film 11A were formed on a silicon substrate 10 in the same manner as in the step shown in FIG. 6 (*a*). Subsequently, a lower electrode 12 was formed on the titanium oxide film by a multi-sputtering method comprising the simultaneous discharge of a platinum target and a titanium oxide target. In this manner, a lower electrode 12 made of a compound of platinum with titanium oxide (platinum: 99% by weight; titanium oxide: 1% by weight) was obtained wherein the grain boundary of the crystalline is present almost perpendicular to the surface of the substrate 10 and the relationship between the vertical width and the horizontal width of the crystal grains is from not less than 1/10 to not more than 1/3 as calculated in terms of the ratio of horizontal width to vertical width.

Thereafter, a PZT film 14 and an upper electrode 16 were formed on the lower electrode 12 in the same manner as in Example 4 to obtain a thin piezoelectric film element. It was confirmed that the thin piezoelectric film element according to Example 5, too, exhibits a high piezoelectric strain constant.

Figure 11:
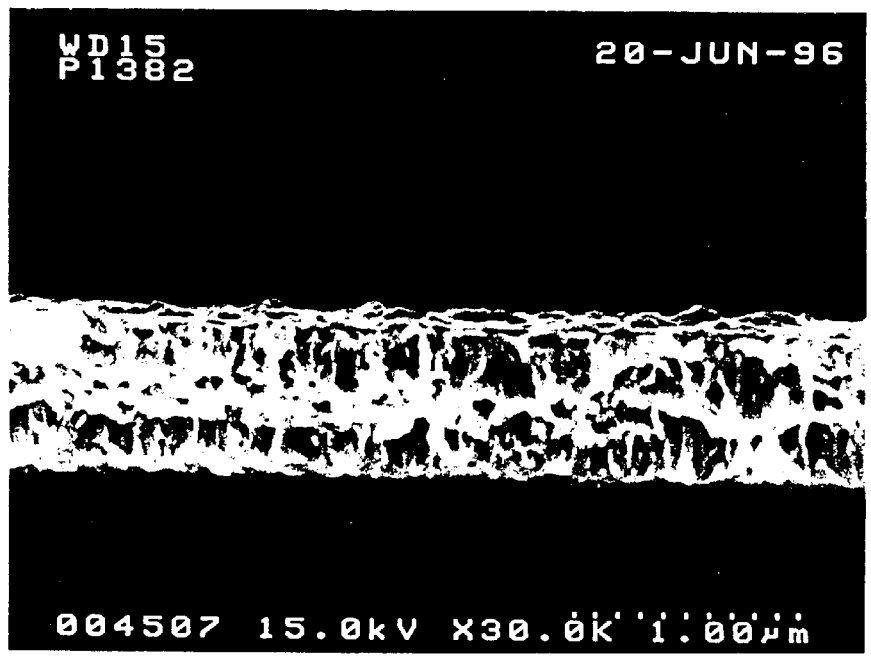
FIG. 11 is a scanning electron microscope photograph of a section of a lower electrode constituting Comparison.

The thin piezoelectric film element according to Example 5 (Invention 2) and a thin piezoelectric film element having the same structure as Invention 2 except that the lower electrode is made of platinum alone (Comparison 2) were examined for the generation of warpage or distortion. FIG. 11 is a scanning electron microscope photograph illustrating a section of the lower electrode constituting Comparison 2. FIG. 11 is an example comparative to FIG. 10 and shows PZT having a-non-columnar structure. This examination was carried out by measuring the warpage of the substrate on which the foregoing thin piezoelectric film element had been formed.

As a result, Invention 2 showed little or no warpage or distortion. However, it was confirmed that Comparison 2 shows a greater warpage or distortion than Invention 2.

Further, Invention 2 and Comparison 2 were examined for the adhesion between the lower electrode 12 and the PZT film 14 and the adhesion between the lower electrode 12 and the titanium oxide film 11A. This examination was carried out by means of a scratch tester. As a result, it was confirmed that Invention 2 is excellent both in the adhesion between the lower electrode and the PZT film and the adhesion between the lower electrode and the titanium oxide film as compared with Comparison 2.

In the present example, the lower electrode was made of the foregoing composition. However, the present invention is not limited to this composition. The platinum content may be from 90 to 99.5% by weight, and the titanium oxide content may be from 0.5 to 10% by weight.

The present example has been described with reference to the lower electrode 14 wherein the grain boundary of the crystalline constituting the lower electrode is present almost perpendicular to the surface of the substrate 10 and the relationship between the vertical width and the horizontal width of the crystal grains is from not less than 1/10 to not more than 1/3 as calculated in terms of the ratio of horizontal width to vertical width. However, the present invention is not limited to this structure. Any lower electrode may be used so far as the grain boundary of the crystalline constituting the lower electrode is present almost perpendicular to the surface of the substrate 10.

Further, the present example has been described with reference to the case where the lower electrode is made of a compound of platinum with titanium oxide. The present invention is not limited to this constitution. The lower electrode may be made of a compound of platinum with an oxide of other metal elements constituting the PZT film. Examples of the oxide other than titanium oxide include lead oxide, zirconium oxide, magnesium oxide, and niobium oxide.

EXAMPLE 6

Figure 12:
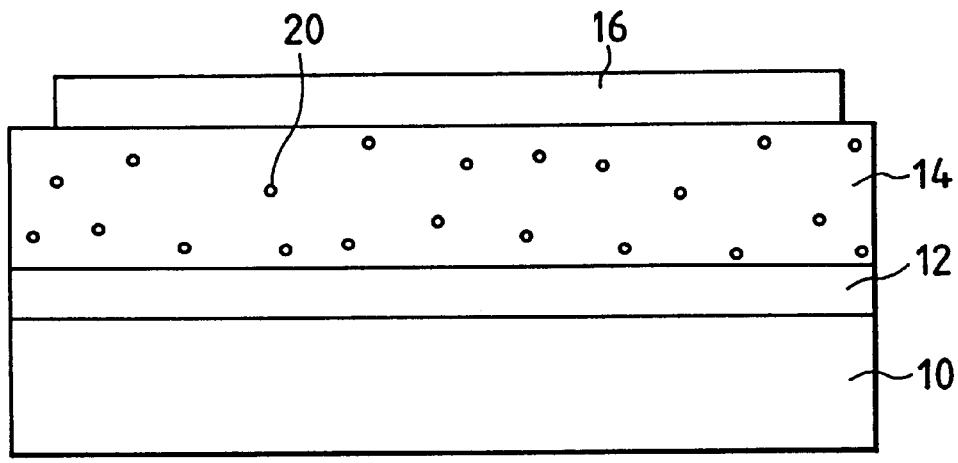
FIG. 12 is an enlarged sectional view of the dotted area of FIG. 1.

An embodiment of the present invention wherein the diameter of closed pores (pores) is controlled to inhibit the generation of cracking in the thin piezoelectric film. An enlarged sectional view of the dotted area in FIG. 1 is shown in FIG. 12. As shown in FIG. 12, the piezoelectric film 10 has pores 20 formed therein. These pores are round-cornered. These pores are sealed in crystal grains or between crystal grains (individual grains are not shown in the drawing). These pores have an average diameter of from 0.01 to 0.1 μm and a surface density of from 0.3 to 5%.

The thickness of the piezoelectric film is preferably from about 0.5 to 25 μm, more preferably from about 1 to 5 μm. Further, the thickness of the other films may be properly determined. For example, the thickness of the Si substrate is preferably from about 10 to 1,000 μm. The thickness of the thermally oxidized Si film is preferably from about 0.05 to 3 μm. The thickness of the upper electrode and the lower electrode are each preferably from about 0.05 to 2 μm.

The process for the preparation of a piezoelectric element comprising this piezoelectric film will be described in detail but the present invention is not limited thereto.

A Si substrate having a thickness of 400 μm and a diameter of 3 inch was washed with sulfuric acid, and then heated at a temperature of 1,000° C. in an oxygen atmosphere containing water vapor for 4 hours so that it was wet-oxidized to form a thermally oxidized Si film having a thickness of 1 μm. Subsequently, a Ti film and a Pt film were continuously sputtered onto the thermally oxidized Si film to a thickness of 200 Å and 2,000 Å, respectively, by dc magnetron sputtering method. Further, with a sintered PZT having a controlled composition as a sputtering target, a piezoelectric precursor film was sputtered onto the Pt film to a thickness of 1 μm by RF magnetron sputtering method. The precursor film thus obtained was amorphous because it had been sputtered without being heated.

The Si substrate on which the precursor film had been formed was then heated in an oxygen atmosphere in a diffusion furnace so that the precursor film was crystallized and sintered to form a piezoelectric film. In this heat treatment, the material was heated at a temperature of 600° C. at a first heating step until it was crystallized, and then sintered at a temperature of 750° C. at a second heating step. The average diameter and surface density of the pores in the piezoelectric film can be well adjusted by controlling the Pb composition ratio in the amorphous film, the temperature at the first heating step and the temperature at the second heating step. If the Pb content in the amorphous film is great, both the pore diameter and surface density tend to increase. If the temperature at the second heating step is high or the heating time is long, the pore diameter tends to increase.

A Pt film was further sputtered onto the piezoelectric film to a thickness of 2,000 Å by dc magnetron sputtering method. Finally, the material was processed as shown in FIG. 1 to give a piezoelectric element having a desired shape.

Piezoelectric elements having different average pore diameters were prepared by changing the foregoing preparation conditions. The generation of cracking in the piezoelectric film and the leakage of electricity between the upper and lower electrodes were as set forth in Table 3.

For the observation of pores, the sample was broken. The section thus developed was then observed by a scanning electron microscope (SEM).

TABLE 3

| Average pore diameter | Cracking | Electricity leakage |
|---|---|---|
| 0 (no pore was observed) | presence | presence |
| 0.02 | absence | absence |
| 0.05 | absence | absence |
| 0.08 | absence | absence |
| 0.15 | absence | presence |
| 0.3 | absence | presence |

The surface density of the pores in the samples shown in Table 3 were predetermined to a range of from 1 to 2%. For the measurement of electricity leakage, a sample having a circular upper electrode having a diameter of 2 mm formed thereon was used. A 100 V voltage was applied across the upper and lower electrodes. It is thought that cracked samples are liable to leakage of electricity at the cracked area.

As a result, it was found that when the average pore diameter is from 0.01 to 0.1 μm, an actuator which shows neither cracking nor electricity leakage can be obtained.

The reason for this mechanism is thought as follows. In some detail, a piezoelectric material undergoes phase transition that changes the crystal structure at its Curie temperature. The heat treatment temperature at which crystallization occurs is higher than Curie temperature. Accordingly, when the temperature of the piezoelectric film, if it is too dense, cools to room temperature, it cannot absorb the resulting distortion and thus undergoes cracking.

Further, the thermal expansion coefficient of the piezoelectric material is relatively greater than that of the silicon substrate. Accordingly, if the piezoelectric film cannot absorb the thermal stress of the silicon substrate, it can undergo cracking.

In other words, it is preferred that the piezoelectric material has some pores formed therein to absorb distortion and stress, making it possible to obtain a film that undergoes no cracking.

On the other hand, if the pore diameter exceeds the above defined range, the piezoelectric film is subject to the effective application of a greater electric field and thus can be destroyed due to leakage.

The product was also subjected to accelerated durability test in the form of piezoelectric element. For this test, a 30 V pulse voltage having a duty of 10% and a frequency of 10 KHz was applied across the upper and lower electrodes. The change in the displacement of the tip of the piezoelectric element was determined.

As a result, the piezoelectric element showed a repeated durability of not less than $2 \times 10^9$ times if its average pore diameter was not more than 0.05 μm. If the average pore diameter was from more than 0.05 μm to not more than 0.1 μm, the displacement showed a drop by the time when the repeated durability reached $2 \times 10^9$ times.

EXAMPLE 7

The procedure of Example 6 was followed to prepare an actuator except that the surface density of pores was changed. The generation of cracking in the piezoelectric film and the leakage of electricity between the upper and lower electrodes were as shown in Table 4.

TABLE 4

| Pore surface density (%) | Cracking | Electricity leakage |
|---|---|---|
| 0.2 | presence | presence |
| 0.5 | absence | absence |
| 1.0 | absence | absence |
| 2.5 | absence | absence |
| 3.5 | absence | presence |
| 5.0 | absence | presence |

The average diameter of pores in the samples set forth in Table 4 were predetermined to a range of from 0.03 to 0.07 μm. As a result, it was found that an actuator having a pore surface density of from 0.3 to 3% which undergoes neither cracking nor leakage of electricity can be obtained. If the pore surface density exceeds the above defined range, the piezoelectric film is subject to the effective application of a greater electric field and thus can be destroyed due to leakage.

The product was also subjected to accelerated durability test in the form of piezoelectric element. The test conditions were the same as used in Example 1. As a result, the piezoelectric element showed a repeated durability of not less than $2 \times 10^9$ times if its pore surface density was not more than 1%. If the pore surface density was from more than 1% to not more than 5%, the displacement showed a drop by the time when the repeated durability reached $2 \times 10^9$ times.

In Examples 6 and 7, a Si substrate was used as a substrate. However, a ceramic substrate made of magnesia, alumina, zirconia or the like may be used. These examples have been described with reference to the case where a binary PZT is used as a piezoelectric film. However, it is of course desirable that the material of the piezoelectric film is changed depending on the purpose. For example, in the case of an ink jet recording head described later, the piezoelectric film is preferably made of a tertiary PZT having a Curie point of not lower than 200° C. that can provide a high piezoelectric strain constant d31, more preferably a tertiary PZT comprising lead magnesium niobate incorporated therein as a third component.

Figure 13:
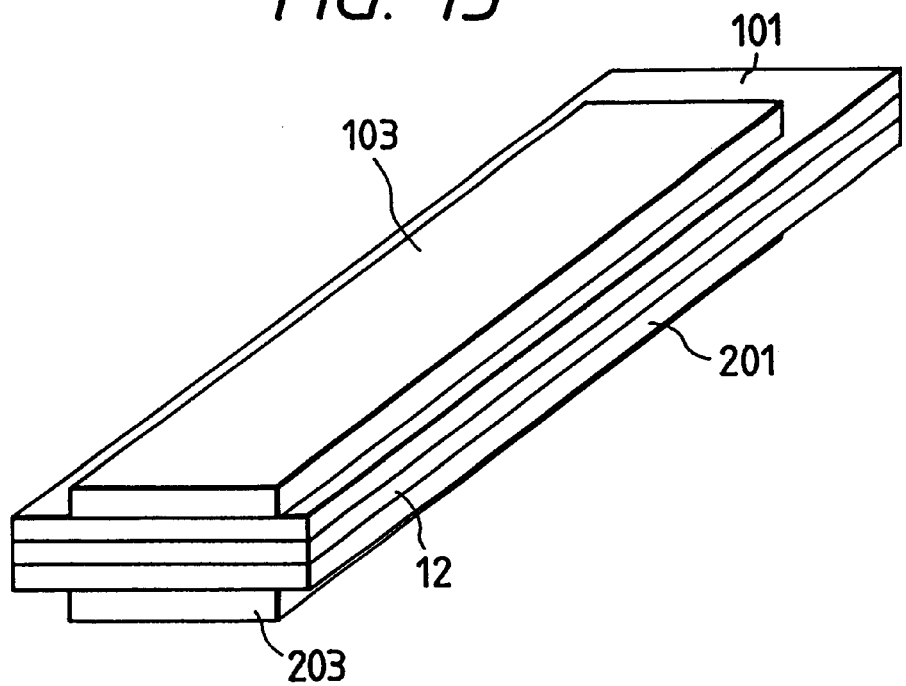
FIG. 13 is a perspective view of a thin piezoelectric film element of the present invention which is used as a bimorph type actuator.

FIG. 1 has been illustrated with reference to a unimorph type actuator. However, as shown in FIG. 13, the present invention can be also applied to a bimorph type actuator. This bimorph type actuator is symmetrical about the lower electrode 12. Shown at reference numerals 101 and 201 are piezoelectric films. Shown at reference numerals 103 and 203 are upper electrodes.

(Embodiment 3)

Figure 14:
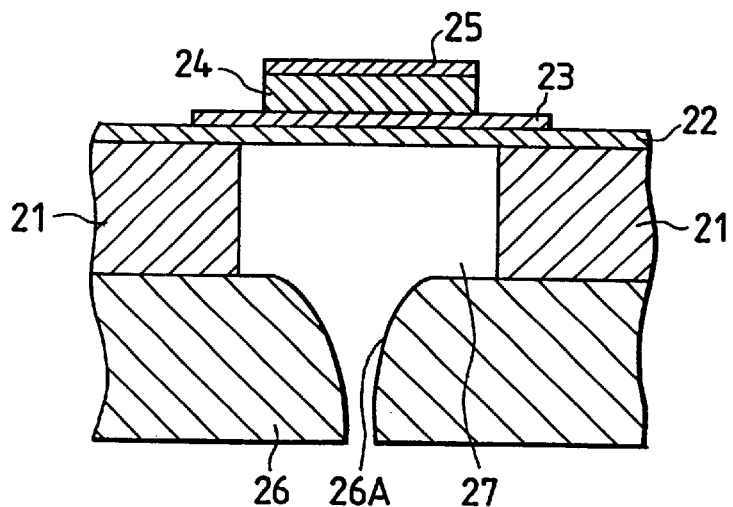
FIG. 14 is a sectional view of a thin piezoelectric film element of the present invention which is used in an ink jet recording apparatus.

III. An ink jet recording apparatus equipped with the foregoing thin piezoelectric film element will be described hereinafter. A cross section of a typical ink jet recording head is shown. FIG. 14 shows one of ink reservoirs of an ink jet recording head comprising a thin piezoelectric film element of the present invention as a vibrator.

The ink jet recording head comprises a silicon substrate 21 having an ink reservoir formed therein, a vibrating plate 22 formed on the silicon substrate 21, a lower electrode 23 formed on the vibrating plate 22 at a desired position, a thin piezoelectric film 24 formed on the lower electrode 23 at a position corresponding to the ink reservoir 27, an upper electrode 25 formed on the thin piezoelectric film 24, and a second substrate 26 bonded to the lower surface of the silicon substrate 21. The substrate 26 has an ink jetting nozzle 26A connected to the ink reservoir 27.

The lower electrode 23 has the structure described in the foregoing examples. So is the thin piezoelectric film 24.

In the ink jet recording head, an ink is supplied into the ink reservoir 27 through an ink passage (not shown). In operation, when a voltage is applied to the thin piezoelectric film 24 across the lower electrode 23 and the upper electrode 25, the piezoelectric film 24 deforms to raise the pressure in the ink reservoir 27 and hence press the ink. The rise in the pressure causes the ink to be jetted through a nozzle (not shown). Thus, ink jet recording is conducted.

The ink jet recording head comprises the foregoing thin piezoelectric film element having excellent piezoelectric characteristics as a vibrator and thus can jet an ink at a high pressure.

In some detail, the piezoelectric film was photoetched to have a pattern having a width of 0.2 mm and a length of 4 mm. The silicon substrate was anisotropically etched to form a groove having a width of 0.3 mm. After forming the upper electrode, the piezoelectric film and a glass-made second substrate are joined to form an ink passage. The piezoelectric film was cut together with the substrate to assemble an ink jet head. The ink jet head was then subjected to ink jetting test. As a result, it was found that the ink jet head has a sufficient injection power. The ink jet head was then mounted in an ink jet recording apparatus. When printing was effected, a good print quality was obtained.

Further, the recording head comprises a single-crystalline silicon substrate chip having a thin piezoelectric film element composed of a lower electrode, a piezoelectric film and an upper electrode integrally formed by a thin film process on a thermally oxidized Si film as a vibrating plate and a cavity (in reservoir) formed therein, and a stainless nozzle plate (second substrate) having a nozzle for jetting an ink, bonded to each other with an adhesive. In order to maximize the displacement, the piezoelectric film was made of a tertiary PZT having lead magnesium niobate as a third component as a material having a high piezoelectric strain constant d31. The thickness of the piezoelectric film was 2 μm. A piezoelectric film having in its section pores having an average diameter of from 0.01 to 0.1 μm and a surface density of from 0.3% to 5% exhibits a reliability of 5 years when used with an actual ink jet recording head. The piezoelectric film was then subjected to durability test. When the piezoelectric film was then subjected to ink jetting test, no print problems occurred even after $4 \times 10^9$ time repetition.

A piezoelectric film formed by photoetching can provide a high precision printing. Further, since such a substrate can form many elements per sheet, the cost can be reduced. Moreover, the production stability and reproducibility of characteristics are excellent. In other words, the use of the thin piezoelectric film element of the present invention makes it possible to prepare an ink jet recording head that can provide high density recording in a high yield at a simple production process.

The thin piezoelectric film element of the present invention can find wide application because of its good characteristics. For example, it may be used as a vibrating plate for ink jet recording head as mentioned above.

As have been mentioned above, the thin piezoelectric film element of the present invention comprises a thin PZT film having an optimum crystal orientation and thus can exhibit improved piezoelectric characteristics.

In the thin piezoelectric film element of the present invention, the grain boundary of the crystalline constituting the thin piezoelectric film element is present almost perpendicular to the surface of the electrode. Thus, the thin piezoelectric film element can exhibit an enhanced piezoelectric strain constant without causing cracking. As a result, a thin piezoelectric film element having a high reliability and a high performance can be provided.

Further, this effect can be enhanced by making the vertical width of the crystal grains greater than the horizontal width of the crystal grains. This effect can be even further enhanced by predetermining the relationship between the vertical width and the horizontal width of the crystal grains within the foregoing range.

Moreover, the lower electrode can be made of a compound of platinum with an oxide of the metal element constituting the piezoelectric film to prevent the substrate from being warped or distorted during heat treatment in the formation of the piezoelectric film. In this arrangement, the adhesion of the lower electrode with the piezoelectric film and substrate can be enhanced.

Further, this effect can be enhanced by arranging the grain boundary of the crystalline constituting the lower electrode present almost perpendicular to the surface of the piezoelectric film. This effect can be even further enhanced by making the vertical width of the crystal grains constituting the lower electrode greater than the horizontal width of the crystal grains.

Further, the thin piezoelectric film element of the present invention can be easily produced without being cracked even its thickness is as relatively great as not less than 0.5 $\mu$m. Thus, the thin piezoelectric film element of the present invention can provide a high density ink jet recording head in a high yield. When subjected to repeated durability test as an actuator to see the displacement, the thin piezoelectric film element of the present invention exhibits a good reproducibility.

Moreover, the ink jet recording head of the present invention comprises the foregoing thin piezoelectric film element as a vibrator and thus can inject an ink at a high pressure.

While the invention has been described in detail and with reference to specific embodiments thereof, it will be apparent to one skilled in the art that various changes and modifications can be made therein without departing from the spirit and scope thereof.

What is claimed is:

1. A thin piezoelectric film element comprising a metal film formed on a substrate and a thin PZT film comprising lead zircotitanate having a third component incorporated therein formed on said metal film, wherein said thin PZT film has a rhombohedral crystalline structure which has (100) orientation of not less than 30% as determined by X-ray diffractometry of thin film.

2. The thin piezoelectric film element according to claim 1, wherein said thin PZT film is formed by sol-gel method.

3. The thin piezoelectric film element according to claim 2, wherein said third component of said thin PZT film is lead magnesium niobate.

4. The thin piezoelectric film element according to claim 3, wherein said thin PZT film is made of Pb(Mg$_{1/3}$Nb$_{2/3}$)$_{0.2}$Zr$_x$Ti$_{0.5-x}$O$_3$ wherein x is from 0.35 to 0.45.

5. The thin piezoelectric film element according to claim 2, wherein the molar ratio of Zr/Ti is from not less than 35/45 to not more than 45/35.

6. A thin piezoelectric film element comprising a piezoelectric film made of a polycrystalline substance and an upper electrode and a lower electrode arranged with said piezoelectric film interposed therebetween, wherein said crystalline substance constituting said piezoelectric film is formed substantially perpendicular to the surface of said electrodes;

wherein the grain boundary of said crystalline substance constituting said piezoelectric film is formed substantially perpendicular to the surface of said electrodes.

7. The thin piezoelectric film element according to claim 6, wherein the crystalline structure of said piezoelectric film is a rhombohedral system which is strongly oriented in either or both of (111) plane and (100) plane.

8. The thin piezoelectric film element according to claim 6, wherein the crystalline structure of said piezoelectric film is a tetragonal system which is strongly oriented in (001) plane.

9. The thin piezoelectric film element according to claim 6, wherein said lower electrode is made of a compound of platinum with an oxide of the metal element constituting said piezoelectric film.

10. The thin piezoelectric film element according to claim 9, wherein said oxide is at least one selected from the group consisting of titanium oxide, lead oxide, zirconium oxide, magnesium oxide and niobium oxide.

11. The thin piezoelectric film element according to claim 6, wherein the grain boundary of the crystalline constituting said lower electrode is present almost perpendicular to the surface of said piezoelectric film.

12. A thin piezoelectric film element comprising a piezoelectric film made of a polycrystalline substance and an upper electrode and a lower electrode arranged with said piezoelectric film interposed therebetween, wherein said lower electrode is made of a compound of platinum with an oxide of the metal element constituting said piezoelectric film;

wherein the grain boundary of the crystalline substance constituting said lower electrode is present substantially perpendicular to the surface of said piezoelectric film.

13. A thin piezoelectric film element comprising a piezoelectric film made of a polycrystalline substance and an upper electrode and a lower electrode arranged with said piezoelectric film interposed therebetween, wherein said lower electrode is made of a compound of platinum with an oxide of the metal element constituting said piezoelectric film;

wherein said oxide is at least one selected from the group consisting of titanium oxide, lead oxide, zirconium oxide, magnesium oxide and niobium oxide.

14. A thin piezoelectric film element comprising a piezoelectric film made of a polycrystalline substance and an upper electrode and a lower electrode arranged with said piezoelectric film interposed therebetween, wherein said lower electrode is made of a compound of platinum with an oxide of the metal element constituting said piezoelectric film;

wherein said piezoelectric film is made of a binary or tertiary lead zircotitanate.

15. A thin piezoelectric film element comprising a piezoelectric film made of a polycrystalline substance and an upper electrode and a lower electrode arranged with said piezoelectric film interposed therebetween, wherein said crystalline substance constituting said piezoelectric film is formed almost perpendicular to the surface of said electrodes;

wherein a PZT film constituting said piezoelectric film is composed of PbZrO$_3$, PbTiO$_3$ and Pb(A$_g$B$_h$)O$_3$ which satisfy the following relationships:

$a+b+c=1$, $0.10 \leq a \leq 0.55$, $0.25 \leq b \leq 0.55$, $0 \leq c \leq 0.5$, supposing $PbZrO_3:PbTiO_3:Pb(A_gB_h)O_3$=a:b:c (molar ratio) wherein A represents a divalent metal selected from the group consisting of Mg, Co, Zn, Cd, Mn and Ni or a trivalent metal selected from the group consisting of Y, Fe, Sc, Yb, Lu, In and Cr; and B represents a pentavalent metal selected from the group consisting of Nb, Ta and Sb or a hexavalent metal selected from the group consisting of W and Te, with the proviso that if A is a trivalent metal and B is not a hexavalent metal or if A is a divalent metal and B is a pentavalent metal, g is 1/3 and h is 2/3.

16. The thin piezoelectric film element according to claim 15, wherein a, b and c, if represented in mol-%, are present in a region surrounded by A', B', C', D', E', and F':

A': (45, 55, 0)

B': (50, 50, 0)

C': (25, 25, 50)

D': (10, 40, 50)

E': (10, 45, 45)

F': (35, 45, 20).

17. A thin piezoelectric film element comprising a piezoelectric film made of a polycrystalline substance and an upper electrode and a lower electrode arranged with said piezoelectric filn interposed therebetween, wherein said cyrstalline substance constituting said piezoelectric film is formed substantially perpendicular to the surface of said electrodes; and wherein the vertical width of crystal grains of the crystalline substance is greater than the horizontal width of crystal grains of the crystalline substrate.

18. The thin piezoelectric film element according to claim 15, wherein A and B are Mg and Nb, respectively.

19. An ink jet recording head comprising a substrate having an ink chamber formed therein, a vibrating plate sealing one end of said ink chamber and having a deflection vibrating mode thin piezoelectric film element fixed on the surface thereof and a nozzle plate sealing the other end of said ink chamber and having an ink jetting nozzle port formed therein, wherein said thin piezoelectric film element is made of a thin piezoelectric film element according to any one of claims 1–5, 6–8, 9–11, 12, 13, 14, 15, 16, 17 and 18.

* * * * *